United States Patent
Wang et al.

(10) Patent No.: US 8,155,901 B2
(45) Date of Patent: Apr. 10, 2012

(54) SYSTEM FOR REMEDYING ELECTRICAL POWER INSTABILITY

(75) Inventors: Shimo Wang, Monterey Park, CA (US); Anthony Paul Johnson, Saugus, CA (US)

(73) Assignee: Southern California Edison, Rosemead, CA (US)

( * ) Notice: Subject to any disclaimer, the term of this patent is extended or adjusted under 35 U.S.C. 154(b) by 895 days.

(21) Appl. No.: 12/113,827

(22) Filed: May 1, 2008

(65) Prior Publication Data

US 2009/0276173 A1 Nov. 5, 2009

(51) Int. Cl.
*G01R 29/00* (2006.01)
*G01R 15/00* (2006.01)
*G01R 21/00* (2006.01)
*G01R 31/00* (2006.01)
*G08B 21/00* (2006.01)
*G05D 99/00* (2006.01)
*G05D 29/00* (2006.01)

(52) U.S. Cl. .............. 702/65; 702/57; 702/60; 324/512; 340/657; 700/286; 700/292

(58) Field of Classification Search ............... 702/7–65, 702/182, 183, 188; 324/500, 512, 521, 522; 340/870.01–870.05, 870.11, 870.4, 870.41, 340/500–501, 506, 511, 657, 660, 661–663, 340/318; 700/286, 291, 292, 293, 295, 297, 700/298

See application file for complete search history.

(56) References Cited

U.S. PATENT DOCUMENTS

| | | | | |
|---|---|---|---|---|
| 7,498,821 | B2 * | 3/2009 | Wells | 324/521 |
| 7,502,696 | B2 * | 3/2009 | Moxley | 702/60 |
| 7,630,863 | B2 * | 12/2009 | Zweigle et al. | 702/188 |

OTHER PUBLICATIONS

IEEE Standard for Synchrophasors for Power Systems, IEEE Std 1344-1995 (R2001).
IEE Standard for Synchrophasors for Power Systems, IEEE Power Engineering Society, IEEE Std C37. 118TM-2005.
M.G. Adamiak, et al. "Wide Area Protection and Control—Today and Tomorrow", IEEE 2006, pp. 1-7.
Miroslav Begovic, "Wide-Area Protectiona and Emergency Control", IEEE, vol. 93, No. 5, May 2006, pp. 876-891.
Joachim Bertsch, "Wide-Area Protection and Power System Utilization", IEEE, vol. 93, No. 5, May 2005, pp. 9971003.
K. Seethalekshmi, "Wide-Area Protection and Control: Present Status and Key Challenges", Fifteenth National power Systems Conference (NPSC), IIT Bombay, Dec. 2008, pp. 169-175.
Yoshizumi Serizawa, IEEE PES PSRC Meeting, San Antonio, TX, "Modular Device Architecture for Wide Area Measuring, Protection and Emergency Control", Jan. 8, 2008.
2004 Power systems Conference & Exposition, Oct., 2004, Wide Area Protection & Emergency Control: Issues and Solutions.

(Continued)

*Primary Examiner* — Mohamed Charioui
*Assistant Examiner* — Ricky Ngon
(74) *Attorney, Agent, or Firm* — Jeffrey G. Sheldon, Esq.; Sheldon Mak & Anderson PC

(57) ABSTRACT

A system for real-time monitoring of synchrophasors from an electrical power system serving multiple geographic areas can control system instability, without preset parameters or thresholds, detects power flow between the generation sources. If a change in power flow of at least 5% over at time period of 1 second or less occurs and the response to the change in power flow is greater than the change in power flow a signal is generated for corrective action.

14 Claims, 3 Drawing Sheets

OTHER PUBLICATIONS

Shimo Wang, "Smart RAS (Remdial Action Scheme)", IEEE 2010.
Shimo Wang, "Adaptive Impact Energy Method for Synchrophasor Measurements Based Inter-Area Instability Prediction and Remedy", IEEE 2008.

* cited by examiner

SYSTEM FOR REMEDYING ELECTRICAL POWER INSTABILITY

BACKGROUND

This invention pertains to the field of electrical power systems, and more specifically to a system for remedying electrical power system instability.

Traditionally, electric utilities utilize complex system models of electrical power systems to examine thousands of simulated events that have the potential to cause reliability problems in delivering electricity to customers. One event that causes problems for systems having connected generation in different geographic areas is transient instability. For example, power swings caused by faults on transmission lines can result in synchronism loss (out-of-step) between electrical power systems. A swing relay is typically installed to detect such power swings. A modeling system instructs the swing relay to take appropriate action when synchronism loss is detected. The swing relay can attempt to remedy the power swings by running back generators or tripping generators offline to restore the electrical power systems to a stable state.

Referring to FIG. 1, there is shown a flowchart of a prior art monitoring system 100 for monitoring electrical power system stability. System status data 102 is compared with a simulated model 104 of instability and a result is produced. The result of the comparison is evaluated 106 to determine if a parameter or a criterion of the model has been violated. If a parameter or criterion has been violated 106, then a corrective action instruction 108 is transmitted to maintain system stability. The corrective action instruction 108 can be, for example, a generator rollback or a generator trip based upon the simulated model.

There are deficiencies in the prior art systems. For example, there is a delay inherent in the system because the simulated models require time consuming calculations to instruct the swing relay. This delay can cause a system crash with attendant blackouts. Also, the modeled events cannot cover all possible real-world events and thus can leave the electrical system vulnerable to non-predicted impact events that can cause power outages, blackouts or brownouts.

Accordingly, there is a need for a system for stabilizing electrical power systems that identifies impact events and quickly responds to the impact event in real-time.

SUMMARY

A method of determining instability in an electrical power system serving at least first and second geographic areas, each geographic area comprising at least one generation source. The method comprising the steps of a) receiving first synchrophasor measurements from a first generation source in the first geographic area; b) receiving second synchrophasor measurements from a second generation source in the second geographic area, the second generation source being geographically separated from the first generation source; c) comparing the first synchrophasor measurements to the second synchrophasor measurements in a first time period to yield a first comparison measurement and then again in a second time period to yield a second comparison measurement; and d) transmitting a remedy control command to the first generation source, the second generation source or both the first generation source and the second generation source when a difference between the first and the second synchrophasor comparison indicates an instability.

A method of determining instability in an electrical power system serving at least first and second geographic areas, each geographic area comprising a generation source. The method comprising the steps of: a) receiving first synchrophasor measurements from a first generation source in the first geographic area; b) receiving second synchrophasor measurements from a second generation source in the second geographic area, the second generation source being geographically separated from the first generation source; c) comparing the first synchrophasor measurements to the second synchrophasor measurements in a first time period to yield a first comparison measurement and then again in a second time period to yield a second comparison measurement, the first and second comparison measurements differing by a sufficient amount to indicate an instability in the system; and d) transmitting a remedy control command to remedy the instability.

Transmitting comprises transmitting the remedy control command to the first generation source, the second generation source or both the first generation source and the second generation source. The remedy control command is transmitted when the first and second comparison measurements differ by at least 5%. The remedy control command transmitted is a trip generator command to take the first generation source, the second generation source or both the first generation source and the second generation source offline, a trip load command to take the load in the first generation source, the load in the second generation source or both the load in the first generation source and the second generation source offline or a run-back generator command to reduce energy flow from the first generation source, the second generation source or both the first generation source and the second generation source. The remedy control command transmitted is to generate an alarm.

A system for controlling an electrical power system serving at least first and second geographic areas, each geographic area comprising a generation source, the system comprising: a) one or more transceivers for receiving first synchrophasor measurements from a first generation source in the first geographic area and second synchrophasor measurements from a second generation source in the second geographic area, the second generation source being geographically separated from the first generation source; b) a monitor communicatively coupled to the transceivers and configured for comparing the an absolute value of the first synchrophasor measurements to the absolute value of the second synchrophasor measurements in a first time period to yield a first comparison measurement and then again in a second time period to yield a second comparison measurement, the first and second time periods differing by at least 1/30 of a second; and c) an alarm communicatively coupled to the monitor for generating a remedy control command when the first and second comparison measurements differ by a sufficient amount to indicate an instability in the system. The system monitor is configured to indicate an instability when the second comparison measurement is at least 5% greater than the first comparison measurement. The system alarm is configured to transmit a remedy control command when an instability is indicated. The remedy control command comprises a rollback command or a disconnect command to one or more of the generation sources, or a disconnect command to one or more of loads.

A method of controlling an electrical power system serving two geographic areas, each geographic area having a generation source, the method comprising the steps of: a) monitoring power flow between the geographic areas using synchrophasors at a location between the generation sources; b) detecting a change in the monitored power flow; c) detecting a system response to the change in power flow using synchrophasors; d) comparing the change in power flow and the system response; and e) generating a corrective signal if the system response is greater than the change in the monitored power flow. The step of comparing comprises determining that the system response is greater than the change in power flow, and wherein a corrective signal is generated.

A system for controlling an electrical power system serving two geographic areas, each area having a generation source, comprising: a) a first generation source; b) a second generation source electrically connected to the first generation source; c) a power flow detector electrically connected to both the first generation source and the second generation source, the power flow detector being between the generation sources, where the power flow detector is capable of detecting a change in power flow using synchrophasors; and d) a transmitter communicatively coupled to the first generation source and the second generation source capable of generating a remedy signal for taking corrective action.

A method of controlling an electrical power system serving two geographic areas, each geographic area having a generation source, the method comprising the steps of: a) monitoring power flow between the geographic areas using synchrophasors at a location between the generation sources; b) detecting a change in the monitored power flow using synchrophasors; c) calculating an impact energy and a reverse energy; d) comparing the reverse energy and the impact energy; and e) generating a corrective signal if the reverse energy is greater than impact energy. The step of comparing comprises determining that the reverse energy is greater than the impact energy, and wherein a corrective signal is generated.

DRAWINGS

These and other features, aspects and advantages of the present invention will become better understood with regard to the following description, appended claims, and accompanying drawings where:

DESCRIPTION

The present invention overcomes limitations of the prior art by providing a real time system to detect and remedy electrical power system transient instability, preferably without the use of simulated equivalent models requiring preset parameters or criteria. The present invention effectively remedies more electrical power system instabilities, in real-time, than can be predicted using simulated events alone.

As used in this disclosure, except where the context requires otherwise, the term "comprise" and variations of the term, such as "comprising", "comprises" and "comprised" are not intended to exclude other components or steps.

The term "syncrophasor" means the phasor portion of an alternating current (AC) power signal representing both the magnitude and phase angle as referenced to an absolute point in time. Techniques for measuring sychrophasors are described in IEEE Std C37.118™-2005 and IEEE Std 1344-1995.

The term "power flow" refers to the rate of flow of electrical energy transmitted from a first location to a second location utilizing the electrical grid.

The term "trip generator command" refers to a command to disconnect a generation source from an electrical load connected to the generation source.

The term "roll back generator command" refers to a command to a generation source to reduce the amount of power flow such as, for example, slowing down an electrical turbine to reduce the amount of electrical energy produced, shunting a portion of the electricity to ground, and the like.

The term "absolute value" refers to a numerical value without regard to its sign, such as, for example, 1 is the absolute value of both 1 and −1.

The term "impact event" refers to a positive or negative electrical phase swing between two or more electrical power generation sources that can be measured, where the power flow from a first generation source to a second generation source is denoted as a function of time: P(t).

The term "impact energy" (IE) means the measurable area of a change in power ($\Delta P$) between two or more generation sources in the first half cycle of an impact event for a given time period ($t_0$ to $t_1$) as denoted in the equation:

$$IE = \int_{t_0}^{t_1} \Delta P(t)\,dt \qquad \text{equation (1)}$$

The term "reverse energy" (RE) means the measurable area of a change in power ($\Delta P$) between two or more generation sources in the second half cycle of an impact event for a given time period ($t_1$ to $t_2$) denoted in the equation:

$$RE = \int_{t_1}^{t_2} \Delta P(t)\,dt \qquad \text{equation (2)}$$

The term "alarm" refers to an audio, visual and/or tactile device that serves to call attention, to warn, or provide information of instability in an electric power system.

The term "geographically separate" refers to a child region that is physically separated from, yet not autonomous of its parent region.

Figure 1:
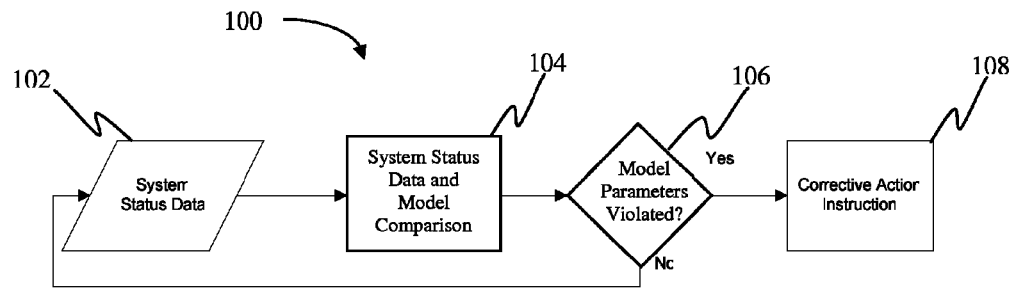
FIG. 1 is a flowchart of a prior art monitoring system for controlling electrical power system stability.
Figure 2:
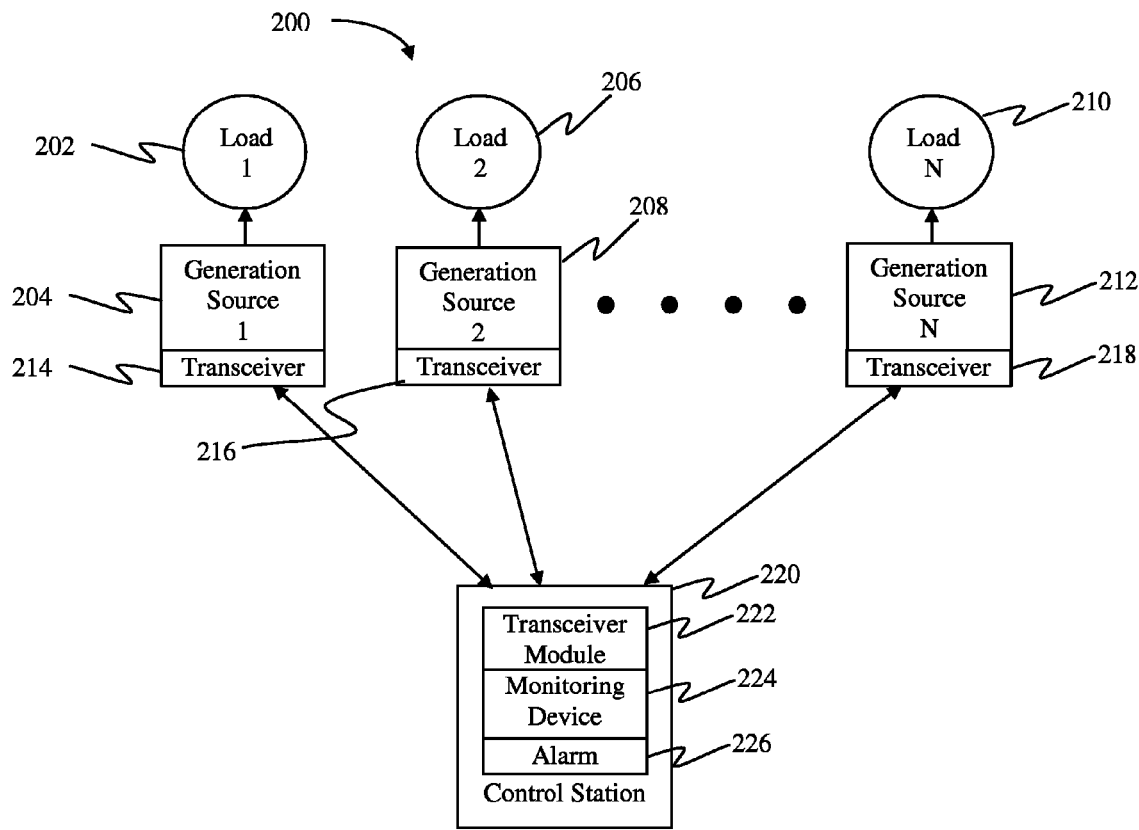
FIG. 2 is a block diagram of an electrical power system and control station for monitoring electrical power system stability, the system having features of the present invention.

Referring to FIG. 2, a system 200 for measuring synchrophasors to detect instability in an electrical power system and signaling that instability is presented. A first electrical load 202 is electrically connected to a first generation source 204, a second electrical load 206 is electrically connected to a second generation source 208, continuing through to an nth electrical load 210 that is electrically connected to an nth generation source 212. The generation sources 204, 208 and 212 can be any source of electricity that provides electricity to an electrical power distribution system such as, for example, a cogeneration plant, a fossil fuel generation plant, a geothermal generation plant, a solar generation station, a solar turbine station, wind turbines, and combinations thereof. The generation sources 204, 208 and 212 can be located in separate geographical locations or within the same geographical location such as, for example, a micro-cogeneration facility in a commercial building, or a residence with solar panels that each provides electricity to the same transmission lines that a utility uses to transmit electricity.

The generation sources 204, 208 and 212 further comprise generator transceivers 214, 216 and 218, respectively, that are communicatively coupled to a control station 220. The control station 220 comprises a control station transceiver 222, a monitoring device 224, and an alarm 226. The control station transceiver 222 is communicatively coupled to the generator transceivers 214, 216 and 218. The generator transceivers 214, 216, 218 and 222 are configured to transmit synchrophasor measurements and receive remedy control commands such as, for example, roll back generator, or turn off generator commands, etc. The monitoring device 224 is configured to perform synchrophasor calculations as described herein. The monitoring device 224 comprises hardware, software, or both hardware and software for performing calculations for comparing the synchrophasor measurements such as, for example, a computer with software, a microprocessor or a hardwired analog computer.

The remedy control command can be a roll-back command, for slowing down the generation sources 204, 208 and 212, a trip generator command to turn off at least one of the generation sources 204, 208 and 212 or load trip to disconnect end users from the electrical power grid 204, 208 and 212 for remedying an electrical power instability in at least one of the generation sources 204, 208 and 212 and the electrical loads 202, 206 and 210. Optionally, the control station 220 can activate an alarm 226 to alert a user that there is a an impact event that is being corrected or that the user is to perform manual intervention, such as, for example, trip at least one of the generation sources 204, 208 and 212, to remedy the electrical power instability.

Figure 3:
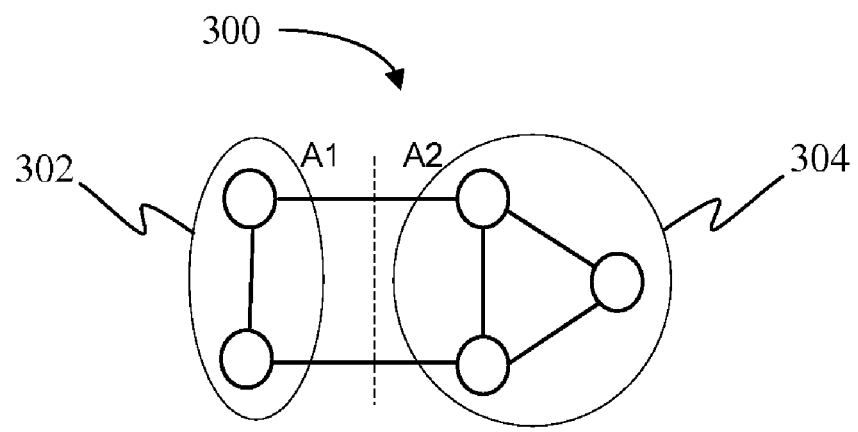
FIG. 3 is a Venn diagram of an electrical power system for which the system of FIG. 2 is useful.

With reference to FIG. 3 an electrical power system can be considered as two portions, a first area 302 and a second area 304. The first area 302 can comprise multiple generation sources where an electrical problem is located. The second area 304 can also comprise multiple generation sources that would be affected if the electrical problem in the first area 302 is not remedied. The areas 302 and 304 can be geographically separated from each other or one of the areas 302 and 304 can be located in the same geographical area as the other area (i.e. one area is nested inside the other area).

Figure 4:
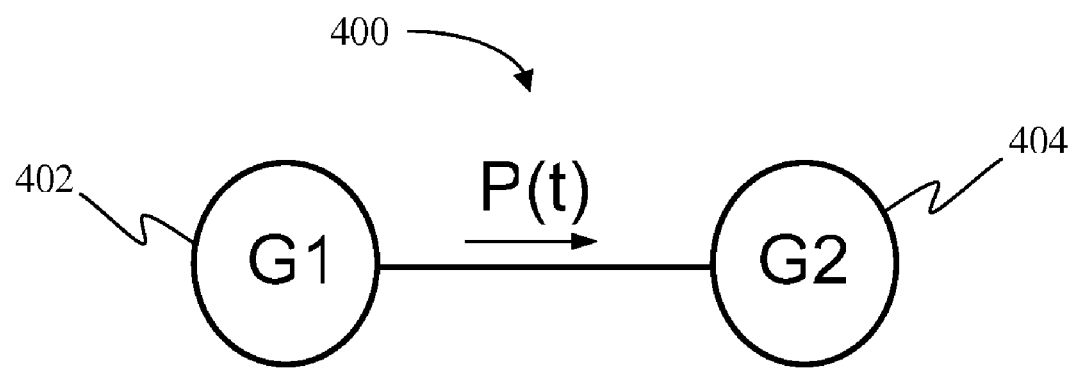
FIG. 4 is a block diagram of a generator system of the electrical power system of FIG. 3.

Each area 302 and 304 can be represented as an equivalent generator system 400, as shown in FIG. 4, the first area 302 is represented by a first generation source 402 and the second area 304 is represented by a second generation source 404. Power flow (P) transmitted from the first generation source 402 to the second generation source 404 is a function of time, denoted as P(t), and can be measured using synchrophasors.

A technique, according to one embodiment, that identifies impact events and quickly responds to remedy the impact event in real-time, comprises the steps of calculating the change in energy (ΔE) between two or more generation sources by subtracting the absolute value of the impact energy (IE) found in equation (1) from the absolute value of the resultant energy (RE) found in equation (2) as shown in the following equation:

$$\Delta E = |IE| - |RE| \qquad \text{equation (3)}$$

Figure 5:
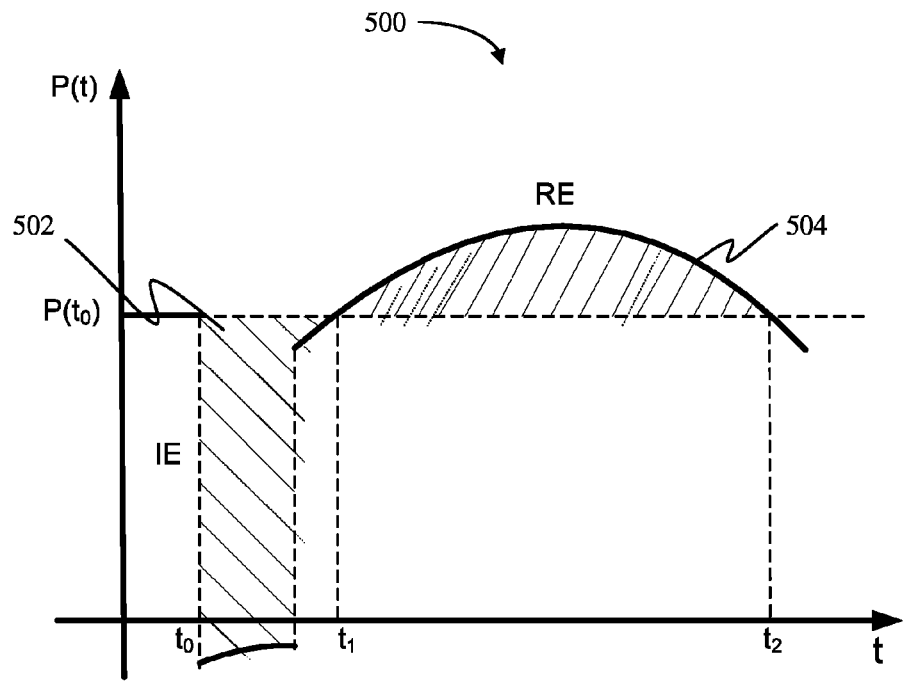
FIG. 5 is graph of power versus time showing impact energy and recovery energy for the electrical power system of FIG. 2 in condition related to instability.

One method of calculating IE and RE is to calculate an area under each curve, measured in real-time by synchrophasors, that is produced by an impact event as shown in FIG. 5. The chart 500 is a plot of the areas comprising the impact energy 502 (IE), determined by receiving first synchrophasor measurements from a first generation source 402 in the first geographic area and second synchrophasor measurements from a second generation source 404 in the second geographic area in a first time period, and the reverse energy 504 (RE), determined by receiving first synchrophasor measurements from a first generation source 402 in the first geographic area and second synchrophasor measurements from a second generation source 404 in the second geographic area in a second time period, versus time. The impact energy 502 is the energy received in a first-half-swing of an electrical power system disturbance, measured between the first area 402 and the second area 404. The reverse energy 504, is the energy the electrical power system releases, measured between the first area 402 and the second area 404, in the second-half-swing of an electrical power system disturbance measured between the first area 402 and the second area 404.

The area under the plot of the impact energy 502 is calculated by:

$$IE = \int_{t_0}^{t_1} \Delta P(t)\, dt \qquad \text{equation (1)}$$

where ΔP is the change in power measured by a synchrophasor, t is the time in seconds, $t_0$ is the time when the impact starts, and $t_1$ is the time when the impact energy 502 crosses the power flow $P(t_0)$ measured at the beginning of an impact event. The area under the plot of the reverse energy 504 is calculated by:

$$RE = \int_{t_1}^{t_2} \Delta P(t)\, dt \qquad \text{equation (2)}$$

where ΔP is the change in power measured by a synchrophasor, t is the time in seconds, $t_2$ is the time when the change in power re-crosses the power flow $P(t_0)$ measured at the beginning of the impact event.

Figure 6:
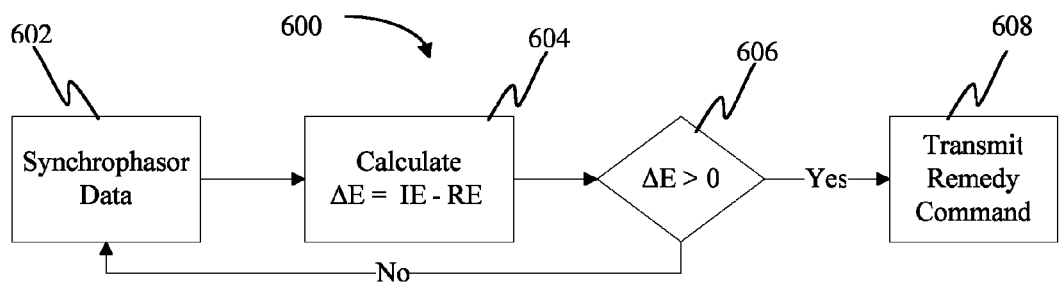
FIG. 6 is a flowchart of a system for monitoring and controlling electrical power system stability according to one embodiment of the present invention.

Referring now to FIG. 6 there is shown a flowchart 600 of a system for monitoring electrical power system stability according to one embodiment of the present invention. First, synchrophasor data 602 is measured. Then, the impact energy of the first swing is calculated 604 by the following:

$$\Delta E = |IE| - |RE| \qquad \text{equation (3)}$$

Then it is determined 606 if the change in energy is greater than zero, ΔE>0. If ΔE is greater than 0, sequential power swings can drive the power flow to divergence and system instability. Thus, if the result of the calculation, ΔE, is greater than zero, then a remedy command 608 is transmitted. Otherwise, when the energy flow difference is less than zero, ΔE<0, sequential power swings are suppressed to convergence and system stability, and thus no remedy is required. The calculation of the energy flow difference, in this embodiment, can be completed quickly and efficiently in real-time with dedicated hardware, such as, for example, an analog style computer, a digital microprocessor, or a computer with software programmed to perform the calculations. Additionally, there is no need for simulated models or parameters because the calculations are effective for power instability occurrences. However, simulated models can be used as a backup or as a first line of defense. Optionally, a threshold can be set to trigger an alarm for user intervention or notification of an impact event.

Although the present invention has been discussed in considerable detail with reference to certain preferred embodiments, other embodiments are possible. Therefore, the scope of the appended claims should not be limited to the description of preferred embodiments contained in this disclosure. All references cited herein are incorporated by reference in their entirety.

What is claimed is:

1. A method of determining instability in an electrical power system serving at least first and second geographic areas, each geographic area comprising at least one generation source, the method comprising the steps of:
   a) receiving first synchrophasor measurements from a first generation source in the first geographic area;
   b) receiving second synchrophasor measurements from a second generation source in the second geographic area, the second generation source being geographically separated from the first generation source;
   c) comparing the first synchrophasor measurements to the second synchrophasor measurements in a first time period to yield an impact energy and a reverse energy; and
   d) transmitting a remedy control command to the first generation source, the second generation source or both the first generation source and the second generation source if the reverse energy is greater than the impact energy, wherein the remedy control command transmitted is a trip generator command to take the first generation source, the second generation source or both the first generation source and the second generation source offline.

2. The method of claim 1, where the remedy control command transmitted is a run-back generator command to reduce energy flow from the first generation source, the second generation source or both the first generation source and the second generation source.

3. A method of determining instability in an electrical power system serving at least first and second geographic areas, each geographic area comprising a generation source, wherein a first load is electrically connected to the first generation source and a second load is electrically connected to the second generation source, the method comprising the steps of:
   a) receiving first synchrophasor measurements from a first generation source in the first geographic area;
   b) receiving second synchrophasor measurements from a second generation source in the second geographic area, the second generation source being geographically separated from the first generation source;
   c) comparing the first synchrophasor measurements to the second synchrophasor measurements in a first time period to yield an impact energy and a reverse energy; and
   d) transmitting a remedy control command if the reverse energy is greater than the impact energy, wherein the remedy control command transmitted is a trip load command to take the first load, the second load, or both loads offline.

4. The method of claim 3 wherein the step of transmitting comprises also transmitting the remedy control command to the first generation source, the second generation source or both the first generation source and the second generation source.

5. The method of claim 3, where the remedy control command transmitted generates an alarm.

6. A system for controlling an electrical power system serving at least first and second geographic areas, each geographic area comprising a generation source, the system comprising:
   a) one or more transceivers for receiving first synchrophasor measurements from a first generation source in the first geographic area and second synchrophasor measurements from a second generation source in the second geographic area, the second generation source being geographically separated from the first generation source;
   b) a monitor communicatively coupled to the transceivers and configured for comparing an absolute value of the first synchrophasor measurements to the absolute value of the second synchrophasor measurements in a first time period to yield an impact energy and then again in a second time period to yield a reverse energy, the first and second time periods differing by $\frac{1}{30}$ of a second; and
   c) an alarm communicatively coupled to the monitor for generating a remedy control command when the reverse energy is greater than the impact energy.

7. The system of claim 6 wherein the remedy control command comprises a rollback command to one or more of the generation sources.

8. The system of claim 6, wherein the remedy control command comprises a disconnect command to one or more of the generation sources.

9. The system of claim 6, wherein a first load is electrically connected to the first generation source and a second load is electrically connected to the second generation source, and wherein the remedy control command comprises a disconnect command to one or more of the loads.

10. A method of controlling an electrical power system serving two geographic areas, each geographic area having a generation source, the method comprising the steps of:
    a) monitoring power flow between the geographic areas using synchrophasors at a location between the generation sources;
    b) detecting a change in the monitored power flow;
    c) detecting a system response to the change in power flow using synchrophasors;
    d) comparing the change in power flow and the system response to yield an impact energy and a reverse energy; and
    e) generating a corrective signal if the reverse energy is greater than the impact energy.

11. The method of claim 10 where the system response is at least greater than the change in power flow.

12. A system for controlling an electrical power system serving two geographic areas, each area having a generation source, comprising:
    a) a first generation source;
    b) a second generation source electrically connected to the first generation source;
    c) a power flow detector electrically connected to both the first generation source and the second generation source, the power flow detector being between the generation sources, where the power flow detector is capable of determining an impact energy in a first time period and a reverse energy in a second time period using synchrophasors; and
    d) a transmitter communicatively coupled to the first generation source and the second generation source capable of generating a remedy signal for taking corrective action when the reverse energy is greater than the impact energy.

13. A method of controlling an electrical power system serving two geographic areas, each geographic area having a generation source, the method comprising the steps of:
    a) monitoring power flow between the geographic areas using synchrophasors at a location between the generation sources;

b) detecting a change in the monitored power flow using synchrophasors;
c) calculating an impact energy and a reverse energy;
d) comparing the reverse energy and the impact energy; and
e) generating a corrective signal if the reverse energy is greater than impact energy.

14. The method of claim 13 wherein the step of comparing comprises determining that the reverse energy is greater than the impact energy, and wherein a corrective signal is generated.

\* \* \* \* \*

UNITED STATES PATENT AND TRADEMARK OFFICE
CERTIFICATE OF CORRECTION

PATENT NO.        : 8,155,901 B2
APPLICATION NO.   : 12/113827
DATED             : April 10, 2012
INVENTOR(S)       : Wang et al.

It is certified that error appears in the above-identified patent and that said Letters Patent is hereby corrected as shown below:

Title Page, Item (75) Inventors, first inventor city of residence "Monterey Park" should read --Westminster--.

Signed and Sealed this
Eighth Day of May, 2012

David J. Kappos
*Director of the United States Patent and Trademark Office*